(12) United States Patent
Reynolds et al.

(10) Patent No.: US 8,232,810 B2
(45) Date of Patent: Jul. 31, 2012

(54) EXTENDED PROXIMITY SENSOR DEVICE WITH ELECTROSTATIC DISCHARGE PROTECTION

(75) Inventors: Joseph Kurth Reynolds, Mountain View, CA (US); Tracy Scott Dattalo, Santa Clara, CA (US)

(73) Assignee: Synaptics Incorporated, Santa Clara, CA (US)

( * ) Notice: Subject to any disclaimer, the term of this patent is extended or adjusted under 35 U.S.C. 154(b) by 403 days.

(21) Appl. No.: 12/464,743

(22) Filed: May 12, 2009

(65) Prior Publication Data

US 2010/0289503 A1 Nov. 18, 2010

(51) Int. Cl.
*G01R 27/26* (2006.01)
*G06F 3/045* (2006.01)

(52) U.S. Cl. ........ 324/662; 324/661; 324/686; 324/688; 345/174

(58) Field of Classification Search .................. 345/174, 345/658

See application file for complete search history.

(56) References Cited

U.S. PATENT DOCUMENTS

| | | | |
|---|---|---|---|
| 6,288,707 B1 * | 9/2001 | Philipp | 345/168 |
| 6,686,546 B2 * | 2/2004 | Chiu | 178/18.01 |
| 6,835,984 B2 | 12/2004 | Derkits, Jr. et al. | |
| 6,987,871 B2 | 1/2006 | Kalnitsky et al. | |
| 7,009,410 B2 | 3/2006 | Ito et al. | |
| 7,433,167 B2 | 10/2008 | Schediwy et al. | |
| 2007/0135701 A1 * | 6/2007 | Fridman et al. | 600/382 |
| 2008/0252608 A1 | 10/2008 | Geaghan | |
| 2009/0160682 A1 * | 6/2009 | Bolender et al. | 341/33 |

* cited by examiner

*Primary Examiner* — Timothy J Dole
(74) *Attorney, Agent, or Firm* — Ingrassia Fisher & Lorenz, P.C.

(57) ABSTRACT

An input device is provided with improved electrostatic discharge protection. Specifically, the input device includes a plurality of capacitive sensing electrodes configured for object detection. An electrostatic discharge (ESD) shunt is disposed near the capacitive sensing electrodes and configured to provide ESD protection to the capacitive sensing electrodes. The input device also includes an extended-proximity capacitive sensing electrode configured to for object detection of relatively distant objects. The ESD shunt has an associated first resistance, and the extended-proximity capacitive sensing electrode has an associated second resistance. The second resistance is greater than the first resistance such that an electrostatic discharge at a first exposed location would be attracted to the ESD shunt via a first potential discharge path instead of being attracted to the extended-proximity capacitive sensing electrode via a second potential discharge path, where the first discharge path is longer than the second discharge path.

20 Claims, 5 Drawing Sheets

EXTENDED PROXIMITY SENSOR DEVICE WITH ELECTROSTATIC DISCHARGE PROTECTION

FIELD OF THE INVENTION

This invention generally relates to electronic devices, and more specifically relates to capacitive sensor devices for producing user interface inputs.

BACKGROUND OF THE INVENTION

Proximity sensor devices (also commonly called touch sensor devices) are widely used in a variety of electronic systems. A proximity sensor device typically includes a sensing region, often demarked by a surface, in which input objects can be detected. Example input objects include fingers, styli, and the like. The proximity sensor device can utilize one or more sensors based on capacitive, resistive, inductive, optical, acoustic and/or other technology. Further, the proximity sensor device may determine the presence, location and/or motion of a single input object in the sensing region, or of multiple input objects simultaneously in the sensor region.

The proximity sensor device can be used to enable control of an associated electronic system. For example, proximity sensor devices are often used as input devices for larger computing systems, including: notebook computers and desktop computers. Proximity sensor devices are also often used in smaller systems, including: handheld systems such as personal digital assistants (PDAs), remote controls, and communication systems such as wireless telephones and text messaging systems. Increasingly, proximity sensor devices are used in media systems, such as CD, DVD, MP3, video or other media recorders or players. The proximity sensor device can be integral or peripheral to the computing system with which it interacts.

One issue with some past proximity sensor devices is susceptibility to electrostatic discharge (ESD). In general, electrostatic discharge is an unwanted momentary flow of electric current. Electrostatic discharge can be caused by the presence of an electric field or through simple contact with an object at a different electric potential. One significant cause of electrostatic discharge is the build up of static electricity. When an object with the significant static electric build up is moved near to, or in contact with, a conductor, an electrostatic discharge current can be induced in the conductor. This current can then flow to any electronic components or devices that are electrically coupled to the conductor.

Electrostatic discharge can damage electronic devices, including proximity sensor devices. Because of this, proximity sensor devices must be protected from electrostatic discharge. This is commonly done with various ESD protection structures that are disposed around the proximity sensor device. Unfortunately, this protection can sometimes interfere with proximity sensor device operation. This problem is particularly acute in extended proximity sensor devices that are implemented to sense object presence at a significant distance from the device. Thus, there is a continuing need to develop proximity sensor devices with electrostatic discharge protection.

BRIEF SUMMARY OF THE INVENTION

The embodiments of the present invention provide an input device with improved electrostatic discharge protection. Specifically, the input device includes a plurality of capacitive sensing electrodes configured for object detection. An electrostatic discharge (ESD) shunt is disposed near the capacitive sensing electrodes and configured to provide ESD protection to the capacitive sensing electrodes. The input device also includes an extended-proximity capacitive sensing electrode configured for object detection of relatively distant objects.

The ESD shunt has an associated first resistance, and the extended-proximity capacitive sensing electrode has an associated second resistance. The second resistance is greater than the first resistance such that an electrostatic discharge at a first exposed location would be attracted to the ESD shunt via a first potential discharge path instead of being attracted to the extended-proximity capacitive sensing electrode via a second potential discharge path, where the first discharge path is longer than the second discharge path. Thus, the extended-proximity capacitive sensing electrode is protected from ESD by the ESD shunt, even for an exposed location where the first discharge path is longer than the second discharge path.

BRIEF DESCRIPTION OF DRAWINGS

The preferred exemplary embodiment of the present invention will hereinafter be described in conjunction with the appended drawings, where like designations denote like elements, and.

DETAILED DESCRIPTION OF THE INVENTION

The following detailed description is merely exemplary in nature and is not intended to limit the invention or the application and uses of the invention. Furthermore, there is no intention to be bound by any expressed or implied theory presented in the preceding technical field, background, brief summary or the following detailed description.

The embodiments of the present invention provide an input device with improved electrostatic discharge protection. Specifically, the embodiments of the present invention provide an input device, at least one capacitive sensing electrode and an extended-proximity capacitive sensor electrode that has an associated resistance greater than a resistance associated with an ESD shunt. The greater resistance provides improved ESD protection of the extended-proximity sensor electrode.

Figure 1:
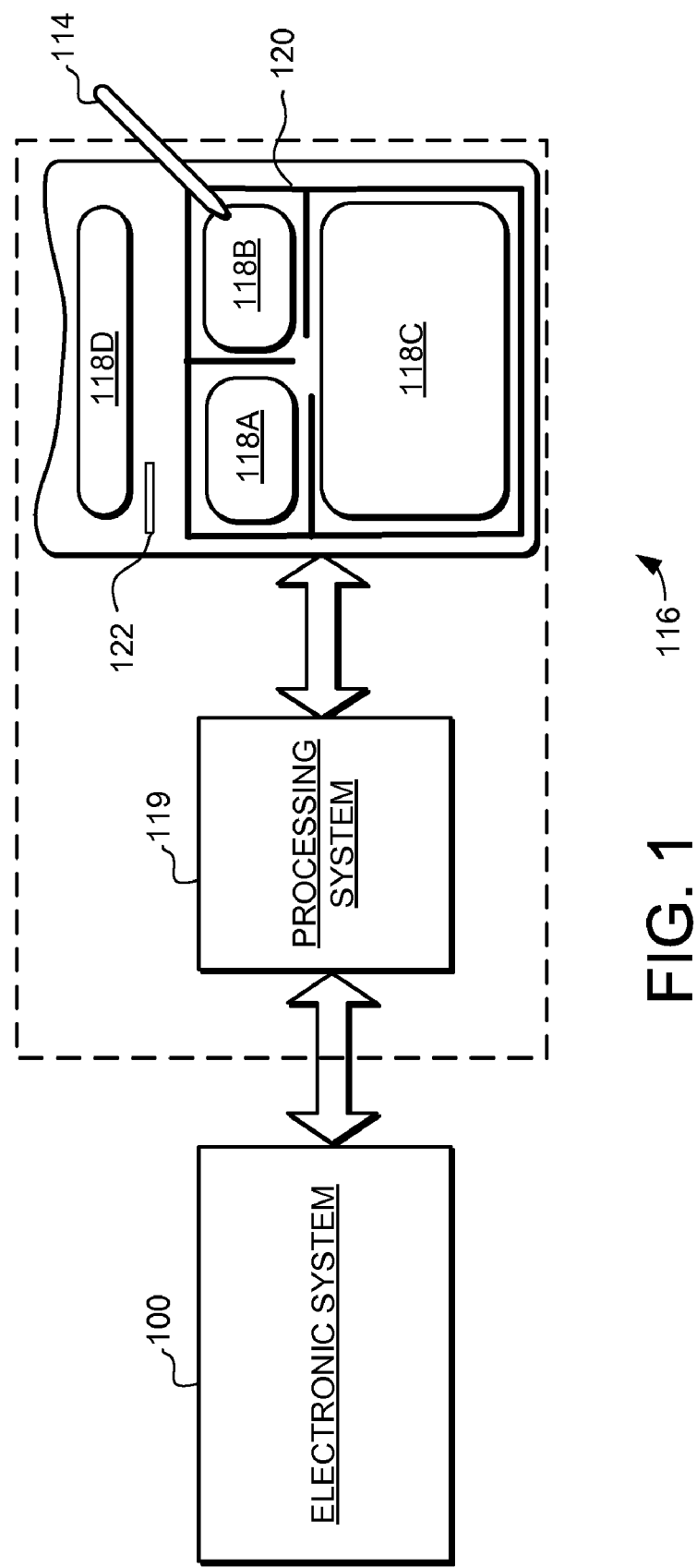
FIG. 1 is a block diagram of an exemplary system that includes an input device in accordance with an embodiment of the invention.

Turning now to the drawing figures, FIG. 1 is a block diagram of an exemplary electronic system 100 that operates with an input device 116. As will be discussed in greater detail below, the input device 116 can be implemented with capacitive proximity sensors to function as a user interface the electronic system 100. The input device 116 has sensing regions 118A-D and is implemented with a processing system 119. Not shown in FIG. 1 is plurality of sensing electrodes that are adapted to capacitively sense objects in the sensing regions 118A-D.

The input device 116 is adapted to provide user interface functionality by facilitating data entry responsive to proximate objects. Specifically, the processing system 119 is configured to determine positional information for objects in any of the sensing regions 118A-D. This positional information can then be used by the system 100 to provide a wide range of user interface functionality.

In the embodiment illustrated in FIG. 1, the sensing regions 118A-D include several distinct regions (118A, 118B, 118C, 118D). Each of these regions 118A-D has one or more corresponding capacitive sensing electrodes disposed on a substrate (not shown in FIG. 1). These various capacitive sensing electrodes are configured to capacitively sense proximate objects in its associated sensing region. In accordance with the preferred embodiment, at least one of these electrodes is configured to detect objects at a relatively greater distance from the sensor device. For example, the sensing electrodes used to implement region 118D can be configured as extended-proximity capacitive sensing electrodes.

As will be explained in greater detail below, for ESD protection an electrostatic discharge (ESD) shunt 120 is disposed near the capacitive sensing electrodes. The ESD shunt 120 has an associated first resistance, and the extended-proximity capacitive sensing electrode has an associated second resistance. The second resistance is greater than the first resistance such that an electrostatic discharge at a first exposed location (e.g., exposed location 122) would be attracted to the ESD shunt 120 via a first potential discharge path instead of being attracted to the extended-proximity capacitive sensing electrode via a second potential discharge path, where the first discharge path is longer than the second discharge path. For example, the exposed location may comprise an opening in a dielectric (e.g. air, plastic, glass, rubber) which allows electrostatic discharge to discharge to the sensing electrodes. Thus, the extended-proximity capacitive sensing electrode is protected from ESD by the ESD shunt 120, even for an exposed location 122 where the first discharge is longer than the second discharge path.

The exemplary electronic system 100 that operates with an input device 116. As used in this document, the terms "electronic system" and "electronic device" broadly refers to any type of system capable of processing information electronically. The input device 116 can be implemented as part of the electronic system 100, or coupled to the electronic system 100 using any suitable technique. As a non-limiting example, the electronic system 100 may comprise another input device (such as a physical keypad or another touch sensor device). Additional non-limiting examples of the electronic system 100 include personal computers such as desktop computers, laptop computers, portable computers, workstations, personal digital assistants, video game machines. Examples of the electronic system 100 also include communication devices such as wireless phones, pagers, and other messaging devices. Other examples of the electronic system 100 include media devices that record and/or play various forms of media, including televisions, cable boxes, music players, digital photo frames, video players, digital cameras, video camera. In some cases, the electronic system 100 is peripheral to a larger system. For example, the electronic system 100 could be a data input device such as a remote control, or a data output device such as a display system, that communicates with a computing system using a suitable wired or wireless technique.

The elements communicatively coupled to the electronic system 100, and the parts of the electronic system, may communicate via any combination of buses, networks, and other wired or wireless interconnections. For example, an input device may be in operable communication with its associated electronic system through any type of interface or connection. To list several non-limiting examples, available interfaces and connections include I$^2$C, SPI, PS/2, Universal Serial Bus (USB), Bluetooth, RF4CE, IRDA, and any other type of wired or wireless connection.

The various elements (e.g. processors, memory, etc.) of the electronic system 100 may be implemented as part of the input device 116 associated with it, as part of a larger system, or as a combination thereof. Additionally, the electronic system 100 could be a host or a slave to the input device. Accordingly, the various embodiments of the electronic system 100 may include any type of processor, memory, or display, as needed.

As noted above, the input device 116 includes sensing regions 118A-D. The input device 116 is sensitive to input by one or more input objects (e.g. fingers, styli, etc.), such as the position of an input object 114 within the sensing regions 118A-D. "Sensing region" as used herein is intended to broadly encompass any space above, around, in and/or near the input device in which sensor(s) of the input device is used to detect user input. In a conventional embodiment, the sensing region of an input device extends from a surface of the sensor of the input device in one or more directions into space until signal-to-noise ratios and algorithms prevent sufficiently accurate object detection. The distance to which this sensing region extends in a particular direction may be on the order of less than a millimeter, millimeters, centimeters, or more, and may vary significantly with the type of sensing technology used and the accuracy desired. Thus, embodiments may require contact with the surface, either with or without applied pressure, while others do not. Typically, input devices are configured to not respond to objects beyond that distance through the use of detection algorithms and thresholds. As noted above, one or more of the regions 118A-D may be implemented with extended-proximity capacitive sensing electrodes to enable a sensing region that extends further out than other sensing regions.

Furthermore, the sizes, shapes, and locations of particular sensing regions may vary widely from embodiment to embodiment. Sensing regions with rectangular two-dimensional projected shape are common, and many other shapes are possible. For example, depending on the design of the sensor array and surrounding circuitry, shielding from any input objects, and the like, sensing regions may be made to have two-dimensional projections of other shapes. Similar approaches may be used to define the three-dimensional shape of the sensing region. For example, any combination of sensor design, shielding, signal manipulation, and the like may effectively define sensing regions 118A-D that extend some distance into or out of the page in FIG. 1.

In operation, the input device 116 suitably detects one or more input objects (e.g. the input object 114) within the sensing region 118A-D. The input device 116 thus includes sensors (not shown) that utilize any combination sensor components and sensing technologies to implement one or more sensing regions 118A-D and detect user input such as presences of object(s). Input devices may include any number of structures, such as one or more sensor electrodes, one or more other electrodes, or other structures adapted to capacitively detect object presence. Many of these capacitive techniques are advantageous to ones requiring moving mechanical structures (e.g. mechanical switches) as they may have a substantially longer usable life.

For example, sensor(s) of the input device 116 may use arrays or other patterns of capacitive sensor electrodes to support any number of sensing regions 118. As another example, the sensor may use capacitive sensing technology in combination with resistive sensing technology to support the same sensing region or different sensing regions. Examples of the types of technologies that may be used to implement the various embodiments of the invention may be found in U.S. Pat. Nos. 5,543,591, 5,648,642, 5,815,091, 5,841,078, and 6,249,234, each assigned to Synaptics Inc.

In some capacitive implementations of input devices, a voltage is applied to create an electric field across a sensing surface. These capacitive input devices detect the position of an object by detecting changes in capacitance caused by the changes in the electric field due to the input object. The sensor may detect changes in voltage, current, or the like.

As an example, some capacitive implementations utilize resistive sheets, which may be uniformly resistive. The resistive sheets are electrically (usually ohmically) coupled to electrodes that receive from the resistive sheet. In some embodiments, these electrodes may be located at corners of the resistive sheet, provide current to the resistive sheet, and detect current drawn away by input devices via capacitive coupling to the resistive sheet. In other embodiments, these electrodes are located at other areas of the resistive sheet, and drive or receive other forms of electrical signals. Depending on the implementation, sometimes the sensor electrodes are considered to be the resistive sheets, the electrodes coupled to the resistive sheets, or the combinations of electrodes and resistive sheets.

As another example, some capacitive implementations utilize transcapacitive sensing methods based on the capacitive coupling between sensor electrodes. Transcapacitive sensing methods are sometimes also referred to as "mutual capacitance sensing methods." In one embodiment, a transcapacitive sensing method operates by detecting the electric field coupling one or more transmitting electrodes with one or more receiving electrodes. Proximate objects may cause changes in the electric field, and produce detectable changes in the transcapacitive coupling. Sensor electrodes may transmit as well as receive, either simultaneously or in a time multiplexed manner. Sensor electrodes that transmit are sometimes referred to as the "transmitting sensor electrodes," "driving sensor electrodes," "transmitters," or "drivers"—at least for the duration when they are transmitting. Other names may also be used, including contractions or combinations of the earlier names (e.g. "driving electrodes" and "driver electrodes"). Sensor electrodes that receive are sometimes referred to as "receiving sensor electrodes," "receiver electrodes," or "receivers"—at least for the duration when they are receiving. Similarly, other names may also be used, including contractions or combinations of the earlier names. In one embodiment, a transmitting sensor electrode is modulated relative to a system ground to facilitate transmission. In another embodiment, a receiving sensor electrode is not modulated relative to system ground to facilitate receipt. In another embodiment, the extended proximity detection sensor electrode is modulated relative to the system (e.g. chassis) ground to improve sensitivity.

In FIG. 1, the processing system (or "processor") 119 is coupled to the input device 116 and the electronic system 100. Processing systems such as the processing system 119 may perform a variety of processes on the signals received from the sensor(s) of input devices such as the input device 116. For example, processing systems may select or couple individual sensor electrodes, detect presence/proximity, calculate position or motion information, or interpret object motion as gestures. Processing systems may also determine when certain types or combinations of object motions occur in sensing regions.

The processing system 119 may provide electrical or electronic indicia based on positional information of input objects (e.g. input object 114) to the electronic system 100. In some embodiments, input devices use associated processing systems to provide electronic indicia of positional information to electronic systems, and the electronic systems process the indicia to act on inputs from users. One example system responses is moving a cursor or other object on a display, and the indicia may be processed for any other purpose. In such embodiments, a processing system may report positional information to the electronic system constantly, when a threshold is reached, in response criterion such as an identified stroke of object motion, or based on any number and variety of criteria. In some other embodiments, processing systems may directly process the indicia to accept inputs from the user, and cause changes on displays or some other actions without interacting with any external processors.

In this specification, the term "processing system" is defined to include one or more processing elements that are adapted to perform the recited operations. Thus, a processing system (e.g. the processing system 119) may comprise all or part of one or more integrated circuits, firmware code, and/or software code that receive electrical signals from the sensor and communicate with its associated electronic system (e.g. the electronic system 100). In some embodiments, all processing elements that comprise a processing system are located together, in or near an associated input device. In other embodiments, the elements of a processing system may be physically separated, with some elements close to an associated input device, and some elements elsewhere (such as near other circuitry for the electronic system). In this latter embodiment, minimal processing may be performed by the processing system elements near the input device, and the majority of the processing may be performed by the elements elsewhere, or vice versa.

Furthermore, a processing system (e.g. the processing system 119) may be physically separate from the part of the electronic system (e.g. the electronic system 100) that it communicates with, or the processing system may be implemented integrally with that part of the electronic system. For example, a processing system may reside at least partially on one or more integrated circuits designed to perform other functions for the electronic system aside from implementing the input device.

In some embodiments, the input device is implemented with other input functionality in addition to any sensing regions. For example, the input device 116 can be implemented with buttons or other input devices near the sensing regions 118A-D. The buttons may be used to facilitate selection of items using the proximity sensor device, to provide redundant functionality to the sensing regions, or to provide some other functionality or non-functional aesthetic effect. Buttons form just one example of how additional input functionality may be added to the input device 116. In other implementations, input devices such as the input device 116 may include alternate or additional input devices, such as physical or virtual switches, or additional sensing regions. Conversely, in various embodiments, the input device may be implemented with only sensing region input functionality.

Likewise, any positional information determined a processing system may be any suitable indicia of object presence. For example, processing systems may be implemented to determine "zero-dimensional" 1-bit positional information (e.g. near/far or contact/no contact) or "one-dimensional" positional information as a scalar (e.g. position or motion along a sensing region). Processing systems may also be implemented to determine multi-dimensional positional information as a combination of values (e.g. two-dimensional horizontal/vertical axes, three-dimensional horizontal/vertical/depth axes, angular/radial axes, or any other combination of axes that span multiple dimensions), and the like. Processing systems may also be implemented to determine information about time or history.

Furthermore, the term "positional information" as used herein is intended to broadly encompass absolute and relative position-type information, and also other types of spatial-domain information such as velocity, acceleration, and the like, including measurement of motion in one or more directions. Various forms of positional information may also include time history components, as in the case of gesture recognition and the like. As will be described in greater detail below, positional information from processing systems may be used to facilitate a full range of interface inputs, including use of the proximity sensor device as a pointing device for cursor control, scrolling, and other functions.

In some embodiments, an input device such as the input device 116 is adapted as part of a touch screen interface. Specifically, a display screen is overlapped by at least a portion of a sensing region of the input device, such as one or more of the sensing regions 118A-D. Together, the input device and the display screen provide a touch screen for interfacing with an associated electronic system. The display screen may be any type of electronic display capable of displaying a visual interface to a user, and may include any type of LED (including organic LED (OLED)), CRT, LCD, plasma, EL or other display technology. When so implemented, the input devices may be used to activate functions on the electronic systems. In some embodiments, touch screen implementations allow users to select functions by placing one or more objects in the sensing region proximate an icon or other user interface element indicative of the functions. The input devices may be used to facilitate other user interface interactions, such as scrolling, panning, menu navigation, cursor control, parameter adjustments, and the like. The input devices and display screens of touch screen implementations may share physical elements extensively. For example, some display and sensing technologies may utilize some of the same electrical components for displaying and sensing.

As noted above, the ESD shunt 120 in the input device is provided for ESD protection. In general, the ESD shunt 120 comprises a conductor that is coupled to a system ground. The ESD shunt is typically formed from a highly conductive material and coupled to a ground, such as the chassis ground for the system. For example, the ESD shunt 120 is commonly formed with copper or silver ink. These materials can provide sufficient conductivity to carry the current generated by a typical ESD without rising substantially in voltage. Any rise in voltage along the dielectric spacing of the shunt and an electrode may not allow a secondary breakdown or discharge to another electrode.

The ESD shunt 120 is preferably disposed close to the devices it is configured to protect from electrostatic discharge. For example, in a typical capacitive sensor device the ESD shunt will be formed close to the capacitive sensing electrodes. As such, an ESD strike close to the capacitive sensing electrodes will be attracted to the ESD shunt 120. Because the ESD shunt 120 is electrically coupled to a ground, the ESD strike will follow the shunt to the ground. This protects the electronics (such as elements of the processing system 119) that are coupled to the capacitive sensing electrodes from the high discharge current and any excessive voltage that would otherwise result.

In general, the closer the ESD shunt 120 is disposed to an exposed location or starting location for an ESD event, the greater the likelihood that an ESD strike will be preferentially attracted to the ESD shunt 120 rather than to a capacitive sensing electrode nearby. However, one issue with the ESD shunt 120 is that it can interfere with the operation of the capacitive sensing electrodes. Specifically, as noted above, during a typical operation of the sensor device the capacitive sensing electrodes are driven to create an electric field. Because the ESD shunt is a relatively large grounded conductor it can alter these electric fields. This electrical field disruption caused by the ESD shunt can interfere with the capacitive coupling to the input object, and thus can interfere with detection of the input object. This is a particular issue for the detection of objects that are relatively far away from the surface, as the detection of these objects relies on a relatively long range electric field.

Figure 3B:
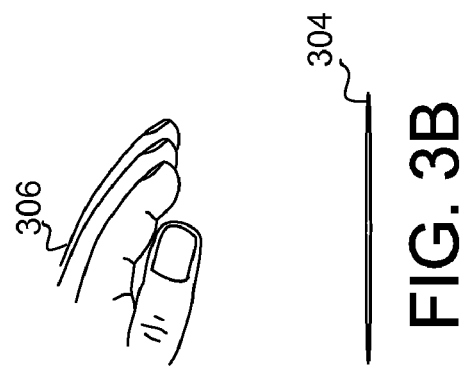
FIGS. 2 and 3 are schematic views of a input objects in sensing regions of proximity sensor devices.
Figure 3A:
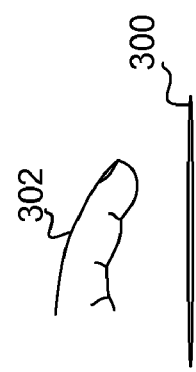
Figure 2:
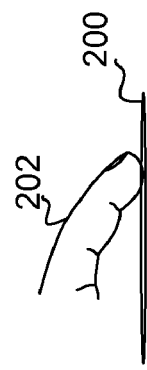

Turning now to FIGS. 2, 3A and 3B, several examples of objects in a sensing region are illustrated. As noted above, in a typical capacitive proximity sensor the sensing regions extend from the surface in one or more directions into space until the noise, decreased signal and algorithms prevent object detection. The algorithms may use filtering and threshold limits among other methods, including non-linear filters and threshold hysteresis. This distance will vary according to the type of technology used. Specifically, this distance will vary with the arrangement and structure of the capacitive sensing electrodes, as well as the filtering and thresholds used in detection. In accordance with the embodiments of the invention, the sensor device comprises at least one extended-proximity capacitive sensing electrode.

Typical capacitive sensing electrode can detect object position for objects relatively near the surface (e.g., finger 202 at the surface 200). The extended-proximity capacitive sensing electrode facilitates position detection at some distance away from the surface (e.g., finger 302 is away from the surface 300). Furthermore, in some implementations, relatively larger objects can be detected a considerable distance away from the surface. Thus, an extended-proximity capacitive sensing electrode can be implemented to facilitate detection of a hand as it passes a significant distance over the surface (e.g., hand 306 passing over the surface 304). In general, an extended-proximity capacitive sensing electrode can be implemented by providing sufficient conductive material in the electrode and reducing or eliminating isolative materials above the electrode. Additionally, the structure and arrangement of the capacitive sensing electrodes, as well as the filtering and thresholds used in detection, can be selected to facilitate the desired range of detection. When so implemented, the coupling from the extended-proximity electrode is affected by the presence of an input object (e.g. a finger 302 or a hand 306) at relatively farther distance from the surface, and thus such an input object can be reliably detected.

As noted above, the detection of objects that are relatively far away from the surface requires a relatively long range electric field, and the presence of an ESD shunt can interfere with such a long range electric field. For these reasons and others, it may be required to position the ESD shunt relatively far away from extended-proximity sensing electrode. This can limit the effectiveness of the ESD shunt in protecting the extended-proximity sensing electrode.

This can be a particular issue where there exists one or more exposed locations near the extended-proximity sensing electrode. In a typical implementation, the sensor device is implemented by disposing the plurality of capacitive sensing electrodes, the extended proximity sensing electrode, and the ESD shunt on a substrate. This substrate can comprise any suitable substrate materials, such as the various commercial hard and flexible substrates (e.g. a PCB). However, it is not necessary, but sometimes desired to dispose the extended-proximity sensing electrode not on the same substrate as the ESD shunt and capacitive sensing electrodes. Typically, the substrate will also include the various routing traces needed to interconnect the sensor device, and one or more processing elements that are part of the processing system 119 (e.g., power, guard, etc). These processing elements can comprise various controllers and other application specific integrated circuits (ASICs).

Figure 4:
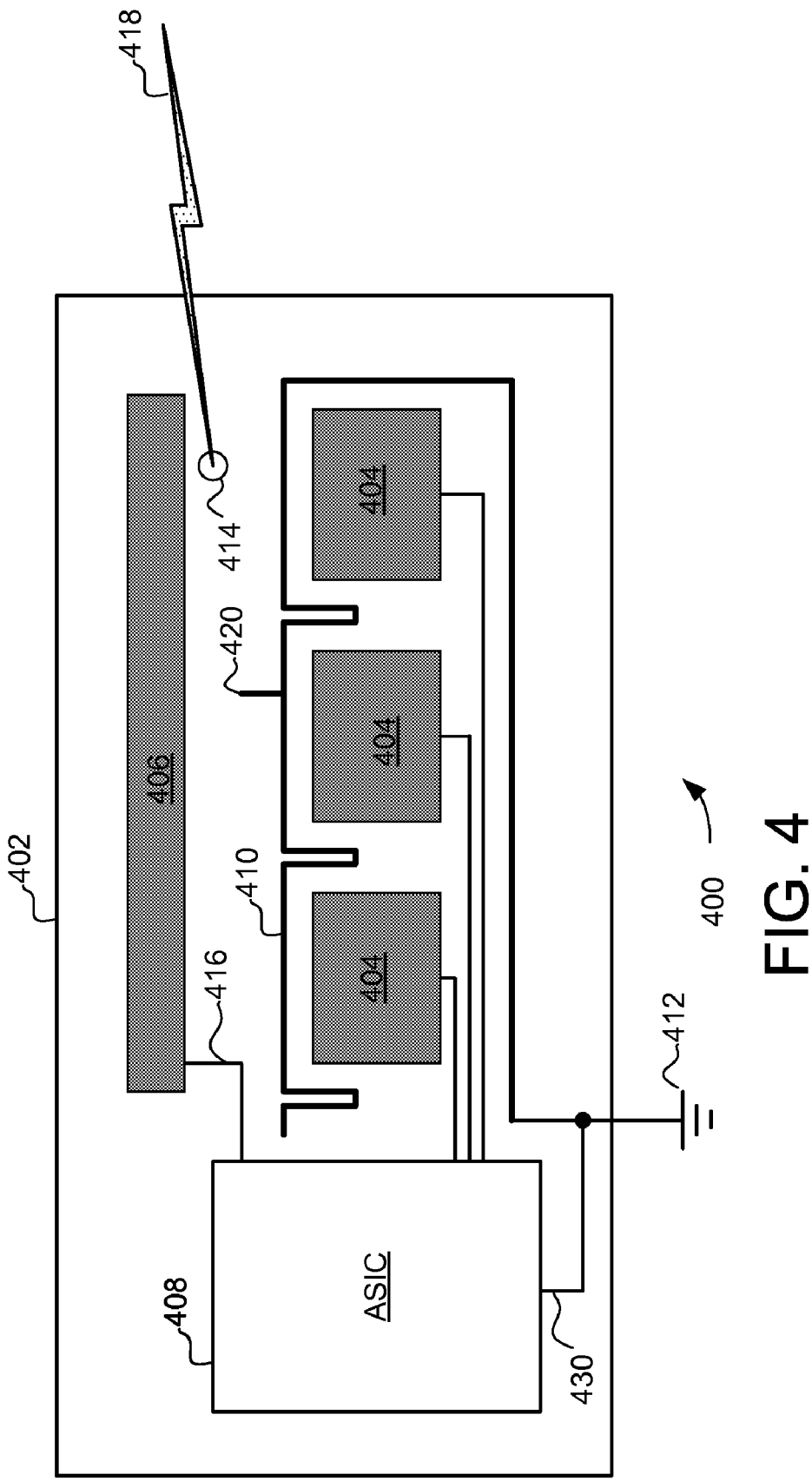
FIG. 4 is a schematic view of an proximity sensor device in accordance with an embodiment of the invention.

Turning now to FIG. 4, an example implementation of a proximity sensor device 400 is illustrated. The proximity sensor device 400 includes a substrate 402. Disposed on the substrate 402 are a plurality of capacitive sensing electrodes 404 and an extended-proximity sensing electrode 406. The plurality of capacitive sensing electrodes 404 and the extended-proximity sensing electrode 406 are coupled to a processor (i.e., ASIC 408) through a plurality of routing traces formed on the substrate 402, with the ASIC 408 providing all or part of the processing for the sensor device 400. Disposed near the capacitive sensing electrodes 404 is an ESD shunt 410 coupled to a chassis ground 412. In this embodiment, the ESD shunt 410 is formed around the capacitive sensing electrodes 404, but is relatively distant from the extended-proximity sensing electrode 406, for example, to avoid interfering with the extended-proximity sensing electrode 406, or for any other reason. In this illustrated embodiment, the ESD shunt 410 includes a protrusion 420 that extends from main section of the shunt and towards the extended-proximity sensing electrode 406. Such a protrusion can improve protection provided to the extended-proximity sensing electrode 406 without substantially increasing the capacitive coupling between the ESD shunt 410 and the extended-proximity sensing electrode 406. In another embodiment, the ASIC 408 may also be connected to the chassis ground using routing trace 430. The routing trace 430 may include a ground plan on some portion of the substrate, and/or a connector and further connection to a chassis ground.

The extended-proximity sensing electrode 406 is implemented to reliably sense objects that are farther away than may be sensed with the capacitive sensing electrodes 404. It should be noted that the electrodes and other various elements can be disposed on the substrate 402 using any suitable procedure (e.g. laminate, electroplated, etc). Additionally, the electrodes and various other elements can be disposed on the substrate 402 by being directly affixed to the substrate 402, or by being affixed to an intermediate item between an element and the substrate 402.

The substrate 402 and other components are configured to be physically coupled into a device or system housing, and can comprise any suitable material. The configuration of the substrate 402 can include the use of materials, dimensions and shapes that are suitable to be mounted into an appropriate housing. This configuration can also include the formation of various mounting elements such as holes and brackets that facilitate the coupling of the substrate 402 with the housing and to facilitate operation of the system (e.g. visibility of LEDs, actuation of tactile switches, etc).

In addition to providing mounting for the substrate 402, a typical housing provides physical and electrical protection to the electronic components inside. For example, a typical housing formed from electrically isolative material provides increased ESD protection for devices that are mounted within. The shape and structure of the housing will largely depend on the particular system the substrate is being implemented with. For example, the housing for a laptop computer may be relatively large, and include features to facilitate the incorporation of various laptop computer features, while a typical housing for a mobile phone would be smaller and typically include fewer features.

One issue with many typical device housings is that the housing may allow for one or more exposed locations on the proximity sensor device. These exposed locations can correspond to openings in the housing resulting from edges, joints, holes or other features in the housing and its related elements. Specifically, because the housing does not provide a complete barrier to ESD strikes at the exposed locations, the proximity sensor device is particularly vulnerable to an ESD strike at those locations. Because of this, system designers typically try to minimize the number of exposed locations, but eliminating them entirely is commonly not possible. It should be noted that the exposed locations may be not be directly adjacent to the opening in the housing, instead it is sufficient that the exposed location is made more vulnerable to ESD because of a corresponding opening or other feature. Furthermore, not all exposed locations will directly correspond to only one specific opening or feature.

Figure 5:
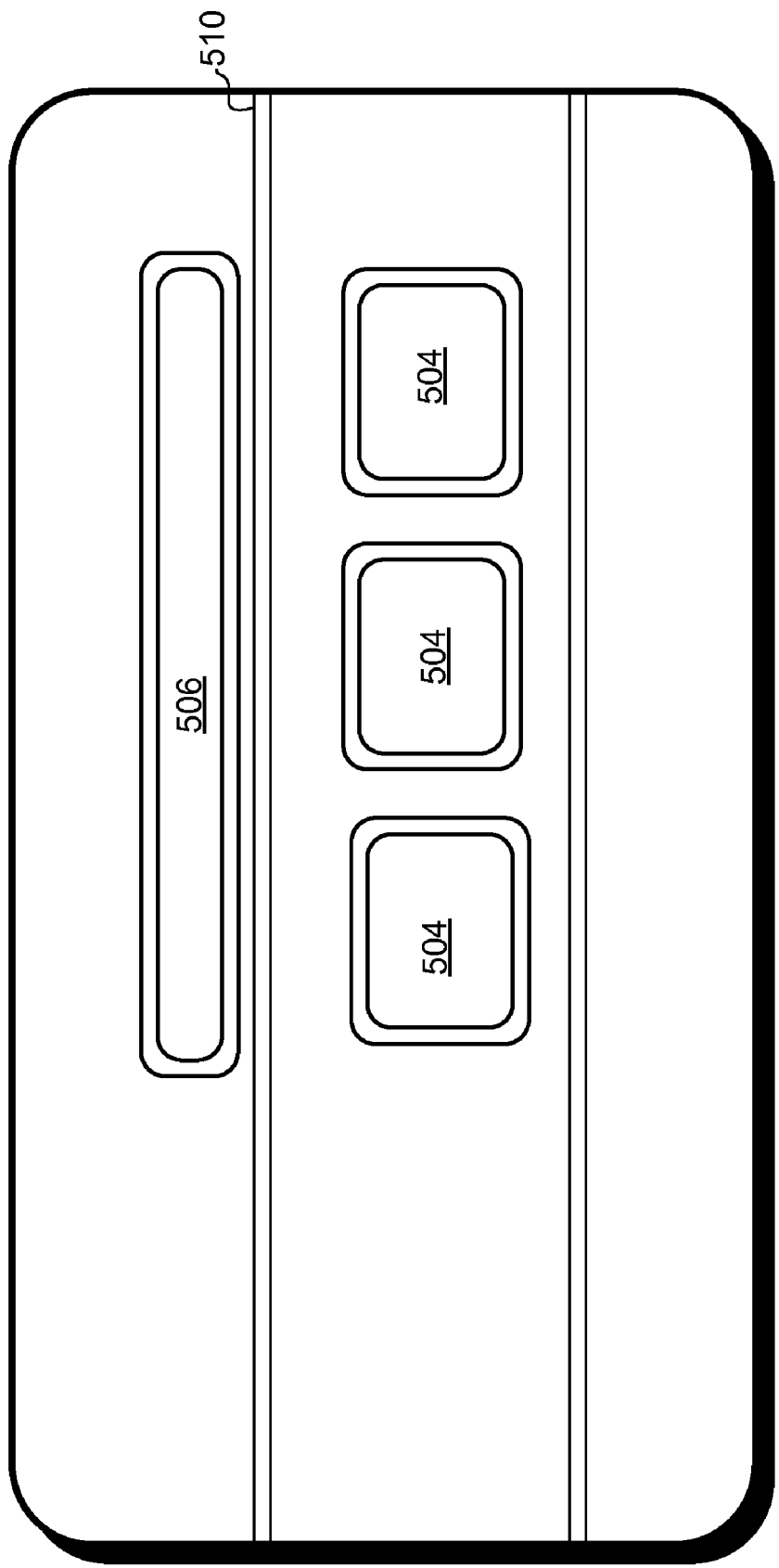
FIG. 5 is a schematic view of an exemplary device housing accordance with an embodiment of the invention.

Turning briefly to FIG. 5, an exemplary housing 500 is illustrated. Housing 500 is only one example of the many different types of housing for which the substrate 402 could be configured to be mounted with. The housing 500 includes protective layers 506 and 504 which are configured to cover and protect the extended-proximity capacitive sensing electrode 406 and the capacitive sensing electrodes 404 respectively. Also included in housing 500 is a feature 510. As will be explained below, the feature 510 corresponds to an exposed location on the proximity sensor device 400. As noted above, exposed locations can be the result of, or correspond to, an opening, edge, thin material section, or any other feature in the housing. Additionally, the presence of materials with low voltage breakdown strength (e.g. light guides, adhesives, etc) or conductive materials can create or contribute to exposed locations. Thus, the feature 510 is merely exemplary of the many types of features that that can create or otherwise correspond to exposed locations on a sensor device.

Returning to FIG. 4 an exemplary exposed location 414 on the proximity sensor device 400 is illustrated by a circle at the substrate 402. This exemplary exposed location 414 is particularly vulnerable to an ESD strike 418. In this case, the exposed location 414 corresponds to the feature 510 in the exemplary housing 500.

In accordance with the embodiments of the invention, the ESD shunt 410 has an associated first resistance, and the extended-proximity capacitive sensing electrode 406 has an associated second resistance. The second resistance is configured to be greater than the first resistance such that an electrostatic discharge corresponding to at least one first exposed location (e.g., exemplary exposed location 414) would be attracted to the ESD shunt 410 via a first potential discharge path instead of being attracted to the extended-proximity capacitive sensing electrode 406 via a second potential discharge path, where the first discharge path is longer than the second discharge path. Thus, the extended-proximity capacitive sensing electrode 406 is protected from ESD by the ESD shunt 410, for at least one exposed location where the first discharge is longer than the second discharge path.

As one example, the second resistance associated with the extended-proximity capacitive sensing electrode 406 can comprise a resistance measured from a location on the extended-proximity capacitive sensing electrode 406 and the ASIC 408. Specifically, from a location on the extended-proximity capacitive sensing electrode 406 that is near the exposed location 414, or near where a potential discharge path from the exposed location 414 reaches the extended-proximity capacitive sensing electrode 406. Likewise, the first resistance associated with the ESD shunt 410 can comprise a resistance measured from a location on the ESD shunt 410 that is the near the exposed location 414, or near where a potential discharge path from the exposed location 414 reaches the ESD shunt 410 to chassis ground. The impedance (e.g. resistance) of routing trace 430 to chassis ground may be very low and insignificant.

As such, part of the second resistance can be the result of the resistance in the routing tracing 416 coupling the extended-proximity capacitive sensing electrode 406 to the ASIC 408, as well as the resistance of the extended-proximity capacitive sensing electrode 406 itself. The second resistance can thus be increased by increasing the resistance of the extended-proximity capacitive sensing electrode 406, and/or by increasing the resistance of the routing trace 416, and/or by adding additional resistive elements in series.

The second resistance can thus be increased by the use of relatively high resistivity materials, or though increasing the length of electrodes and/or routing traces. Additionally, the second resistance can be increased through the addition of discrete resistors in series with the routing traces and/or extended-proximity capacitive sensing electrode 406. Finally, the second resistance can be increased through resistive shapes patterned into the routing trace and/or extended-proximity capacitive sensing electrode.

In some embodiments it is desirable for the second resistance to be significantly larger than the first resistance. Specifically, it can be desirable for the second resistance to be made greater than first resistance such that the vast majority of the current flow and charge resulting from an ESD strike 418 would flow through the ESD shunt 410 to the chassis ground rather than the extended-proximity capacitive sensing electrode 406 to the ASIC 408. For example, it can be desirable for the second resistance to be at least one order of magnitude larger than the first resistance. In other cases the second resistance can be configured to be at least two orders of magnitude larger than the first resistance. In either case, this difference in resistance is great enough to ensure that the current of an ESD strike is strongly preferentially attracted to the ESD shunt 410, and that a majority of current from an ESD strike flows in the ESD shunt 410 to the chassis ground 412.

A wide variety of techniques and structures can be used to implement the extended-proximity capacitive sensing electrode 406 such that it has an associated second resistance greater than the first resistance. For example, the extended-proximity capacitive sensing electrode 406 can be formed of material having a relatively high resistivity. For example, an electrode can be formed with carbon ink can have a sheet resistance of approximately 40 ohms/square. Of course, other conductive materials with sufficient resistivity can also be used, such as conductive plastics (e.g., PEDOT), nano-tubes, and indium tin oxide (ITO). In some embodiments, these materials may be substantially transparent. In contrast, the ESD shunt 410 is typical formed with materials having a relatively low resistivity, such as copper, silver ink, etc.

Additionally, the extended-proximity capacitive sensing electrode 406 can be formed to have dimensions where the length of the electrode 406 is at least an order of magnitude greater than the width. For example, the electrode 406 can be configured to have a thickness of less than 1 mm, a width of approximately 1.2 mm, and a length of between 20 and 100 mm. When made with a suitable material, such an electrode can have an associated linear resistance of at least 20 ohms/mm. In other embodiments, the electrode can have an associated linear resistance of at least 100 ohms/mm, while the ESD shunt has an associated resistance of less than 10 ohms/mm.

It should be noted the various electrodes, ASIC and ESD shunt illustrated in FIG. 4 are merely examples of the types of implementations that can be made. For example, extended-proximity capacitive sensing electrodes can be formed in a wide variety of shapes and structures. Likewise, ESD shunts can be formed in a variety of shapes. Generally it is desirable for the ESD shunt to be closely proximate to those elements it is configured to protect from ESD strikes. Thus, the ESD shunt will typically be formed to surround all or part of the capacitive sensing electrodes. In other embodiments the ESD shunt may be disposed between the individual capacitive sensing electrodes. In other embodiments, the ESD shunt may only be between the extended-proximity capacitive sensing electrode and the capacitive sensing electrodes.

In this application, the term "discharge path" refers to a possible path that could carry current generated from an ESD strike at an exposed location. It should also be noted that it a variety of exposed locations may exist for a particular proximity sensor device. It is not required the resistances be implemented such an electrostatic discharge would be preferentially attracted to the ESD shunt for all possible discharge paths of all possible exposed locations. Instead, it is sufficient that the electrostatic discharge is preferentially attracted to the ESD shunt for one discharge path to the ESD shunt from one exposed location where there exists a shorter discharge path to the extended-proximity capacitive sensing electrode. It is also noted that multiple discharge paths of the current may take place simultaneously or at different times, and that it is sufficient if the highest discharge current will travel through the ESD shunt Turning now to FIG. 6, a portion of an example implementation of a proximity sensor device 600 is illustrated. The proximity sensor device 600 includes a capacitive sensing electrode 604 and an extended-proximity sensing electrode 606. Disposed near the capacitive sensing electrode 604 is an ESD shunt 610. Again, the ESD shunt 610 is formed around the capacitive sensing electrode 604, but is relatively distant from the extended-proximity sensing electrode 606 to avoid interfering with the operation of the extended-proximity sensing electrode 606.

Figure 6:
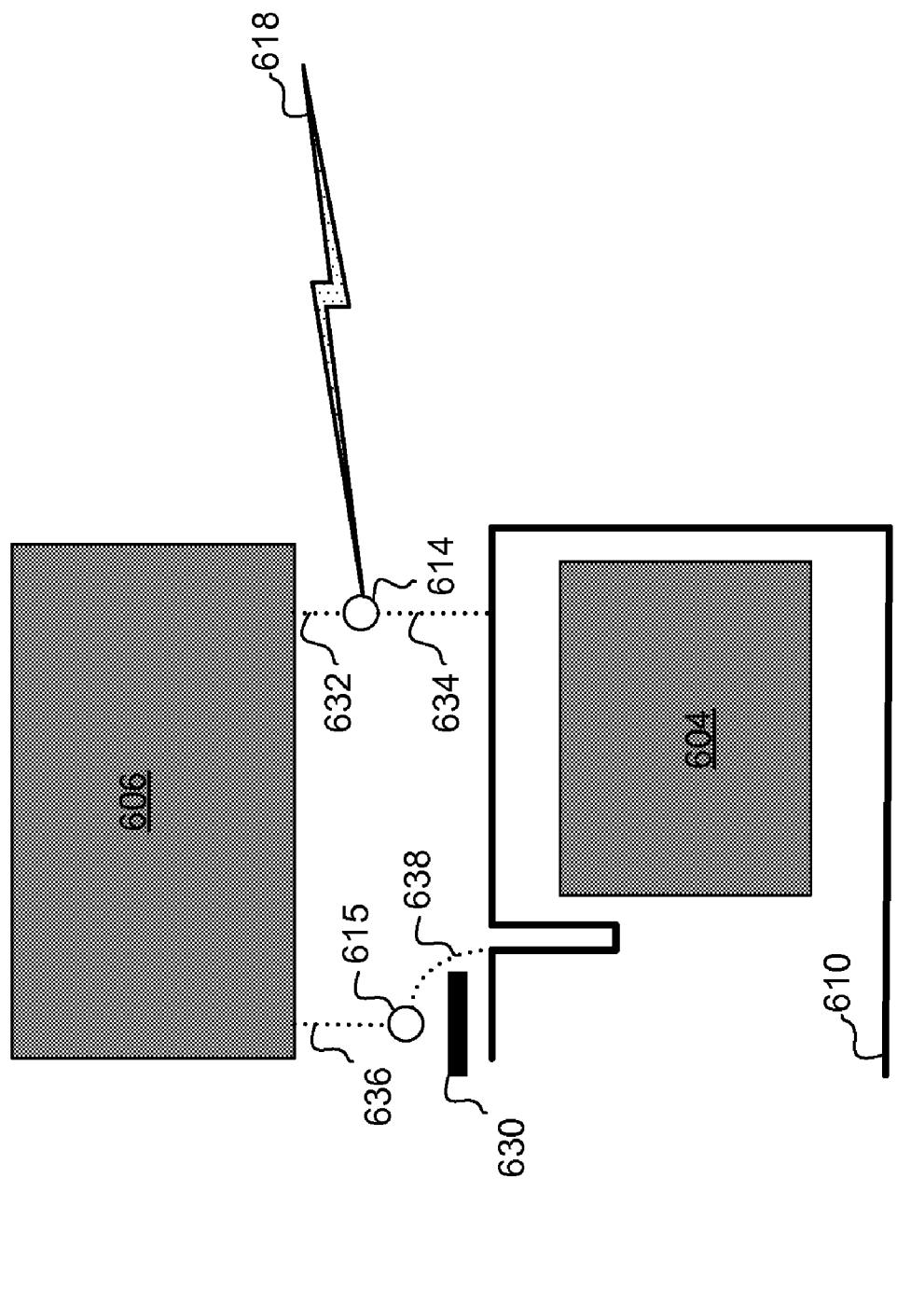
FIG. 6 is a schematic view of a portion of a proximity sensor device in accordance with an embodiment of the invention.

Also illustrated in FIG. 6 are two exemplary exposed locations 614 and 615, illustrated as circles. Furthermore, an isolative feature 630 is disposed between the exposed location 615 and the ESD shunt 610. In accordance with the embodiments of the invention, the ESD shunt 610 has an associated first resistance, and the extended-proximity capacitive sensing electrode 606 has an associated second resistance. The second resistance is configured to be greater than the first resistance such that an electrostatic discharge corresponding to at least one first exposed location (e.g., exemplary exposed location 614 or 615) would be attracted to the ESD shunt 610 via a first potential discharge path instead of being attracted to the extended-proximity capacitive sensing electrode 606 via a second potential discharge path, where the first discharge path is longer than the second discharge path.

In FIG. 6, two potential discharge paths 632 and 634 are illustrated from the exposed location 614. The first illustrated potential discharge path 634 extends from the exposed location 614 to the ESD shunt 610. The second illustrated potential discharge path 632 extends from the exposed location 614 to the extended-proximity capacitive sensing electrode 606. Due to the location of the exposed location 614, the first discharge path 634 is longer than the second discharge path 632. However, because the second resistance is configured to be greater than the first resistance, an electrostatic discharge 618 corresponding to the exposed location 614 would be attracted to the ESD shunt 610 via the potential discharge path 634 instead of being attracted to the extended-proximity capacitive sensing electrode 606 via the second potential discharge path 632.

It should also be noted that the length of such discharge paths could be affected by the presence of other features in the proximity sensor device, other elements, or the housing for which it is configured to be implemented. For example, where isolative elements exist between the exposed location and an electrode or ESD shunt, the discharge path of interest may be extended around such elements. Thus, the length of a discharge path may not always be the shortest straight distance between the exposed location and the ESD shunt. In one embodiment, an isolative element may be formed from a dielectric material and may be associated with the housing layers 504 or 506.

Returning to FIG. 6, two potential discharge paths 636 and 638 are illustrated from the exposed location 615. The first illustrated potential discharge path 638 extends from the exposed location 615 to the ESD shunt 610. Because of the presence of the isolative feature 630, the illustrated potential discharge path 638 curves while extending from the exposed location 615 to the ESD shunt 610. The second illustrated potential discharge path 632 extends from the exposed location 614 to the extended-proximity capacitive sensing electrode 606. Due to curving resulting from the location of the isolative feature 630, the first discharge path 638 is longer than the second discharge path 636. However, because the second resistance is configured to be greater than the first resistance, an electrostatic discharge corresponding to the exposed location 615 would be attracted to the ESD shunt 610 via the potential discharge path 638 instead of being attracted to the extended-proximity capacitive sensing electrode 606 via the second potential discharge path 636.

Thus, the extended-proximity capacitive sensing electrode 606 is protected from ESD by the ESD shunt 610, for both exposed locations 614 and 615, even when first discharge paths are longer than second discharge paths.

The embodiments of the present invention thus provide an input device with improved electrostatic discharge protection. Specifically, the input device includes a plurality of capacitive sensing electrodes configured for object detection. An electrostatic discharge (ESD) shunt is disposed near the capacitive sensing electrodes and configured to provide ESD protection to the capacitive sensing electrodes. The input device also includes an extended-proximity capacitive sensing electrode configured for object detection of relatively distant objects. The ESD shunt has an associated first resistance, and the extended-proximity capacitive sensing electrode has an associated second resistance. The second resistance is greater than the first resistance such that an electrostatic discharge at a first exposed location would be attracted to the ESD shunt via a first potential discharge path instead of being attracted to the extended-proximity capacitive sensing electrode via a second potential discharge path, where the first discharge path is longer than the second discharge path. Thus, the extended-proximity capacitive sensing electrode is protected from ESD by the ESD shunt, even for an exposed location where the first discharge is longer than the second discharge path.

The embodiments and examples set forth herein were presented in order to best explain the present invention and its particular application and to thereby enable those skilled in the art to make and use the invention. However, those skilled in the art will recognize that the foregoing description and examples have been presented for the purposes of illustration and example only. The description as set forth is not intended to be exhaustive or to limit the invention to the precise form disclosed.

What is claimed is:

1. A sensing device comprising:
a substrate;
a plurality of capacitive sensing electrodes disposed on the substrate, the plurality of capacitive sensing electrodes configured to detect objects that are relatively near a surface;
an electrostatic discharge (ESD) shunt disposed on the substrate, the ESD shunt having an associated first resistance, the ESD shunt shaped to at least partially surround the plurality of capacitive sensing electrodes; and
an extended-proximity capacitive sensing electrode formed outside the at least partially surrounded plurality of capacitive sensing electrodes, the extended-proximity capacitive sensing electrode configured to provide a relatively long range electrode field to detect objects that are relatively far from the surface, the extended-proximity capacitive sensing electrode having an associated second resistance, the second resistance substantially greater than the first resistance such that an electrostatic discharge at a first exposed location would be attracted to the ESD shunt via a first potential discharge path to the ESD shunt instead of the extended-proximity capacitive sensing electrode via a second potential discharge path to the extended-proximity capacitive sensing electrode, where the first potential discharge path is longer than the second potential discharge path.

2. The sensing device of claim 1 wherein the extended-proximity capacitive sensing electrode is configured to couple to a processor through a routing trace, and wherein the second resistance comprises a resistance between a location on the extended-proximity capacitive sensing electrode near the first exposed location and the processor.

3. The sensing device of claim 2 further comprising a discrete resistor ohmically in series with the routing trace such that the discrete resistor contributes to the second resistance.

4. The sensing device of claim 1 wherein the first resistance comprises a resistance between a location on the ESD shunt and a system ground.

5. The sensing device of claim 1 wherein the second resistance is at least one order of magnitude larger than the first resistance.

6. The sensing device of claim 1 wherein the extended-proximity capacitive sensing electrode has a linear resistance of at least 20 ohms/mm.

7. The sensing device of claim 6 wherein the ESD shunt has a linear resistance of less than 10 ohms/mm.

8. The sensing device of claim 1 wherein the extended-proximity capacitive sensing electrode comprises carbon ink.

9. The sensing device of claim 1 wherein the extended-proximity capacitive sensing electrode has a length, a width, and a thickness, and wherein the length is at least an order of magnitude greater than the width and the thickness.

10. The sensing device of claim 1 wherein the ESD shunt surrounds at least a portion of the plurality of capacitive sensing electrodes, and wherein the extended-proximity capacitive sensing electrode is disposed on the substrate and farther from a center of the plurality of capacitive sensing electrodes than the ESD shunt.

11. The sensing device of claim 1 wherein the extended-proximity capacitive sensing electrode is disposed on the substrate, and wherein at least a portion of the ESD shunt is between the plurality of capacitive sensing electrodes and the extended-proximity capacitive sensing electrode.

12. A sensing device configured to be in an assembly comprising:
a substrate;
a plurality of capacitive sensing electrodes disposed on the substrate, the plurality of capacitive sensing electrodes configured to detect objects that are relatively near a surface;
an electrostatic discharge (ESD) shunt disposed on the substrate, the ESD shunt shaped to at least partially surround the plurality of capacitive sensing electrodes, the ESD shunt having an associated first resistance, where the first resistance comprises a resistance between a location on the ESD shunt and a system ground;
a first exposed location, the first exposed location being a location that would be exposed after assembly, the first exposed location having an associated first discharge path to the ESD shunt; and
an extended-proximity capacitive sensing electrode formed outside the at least partially surrounded plurality of capacitive sensing electrodes, the extended-proximity capacitive sensing electrode configured to provide a relatively long range electrode field to detect objects that are relatively far from the surface, the extended-proximity capacitive sensing electrode having an associated second discharge path from the first exposed location, the first discharge path longer than the second discharge path, the extended-proximity capacitive sensing electrode having an associated second resistance, where the second resistance comprises a resistance between a location on the extended-proximity capacitive sensing electrode and a processor, the second resistance greater than the first resistance such that an electrostatic discharge at the first exposed location would be more attracted to the ESD shunt via the first discharge path than to the extended-proximity capacitive sensing electrode via the second discharge path.

13. The sensing device of claim 12 further comprising a discrete resistor and a routing trace, the discrete resistor ohmically in series with the routing trace, the discrete resistor and the routing trace configured to couple the extended-proximity capacitive sensing electrode with the processor such that the discrete resistor and the routing trace contribute to the second resistance.

14. The sensing device of claim 12 wherein the second resistance is at least one order of magnitude larger than the first resistance.

15. The sensing device of claim 12 wherein the extended-proximity capacitive sensing electrode has a linear resistance of at least 100 ohms/mm and the ESD shunt has a linear resistance less than 10 ohms/mm.

16. The sensing device of claim 12 wherein the extended-proximity capacitive sensing electrode comprises a patterned resistive material.

17. The sensing device of claim 12 wherein the ESD shunt surrounds at least majority of the plurality of capacitive sensing electrodes, and wherein the extended-proximity capacitive sensing electrode is farther from a center of the plurality of capacitive sensing electrodes than the ESD shunt.

18. The sensing device of claim 12 wherein the extended-proximity capacitive sensing electrode is disposed on the substrate, and at least a portion of the ESD shunt is between the plurality of capacitive sensing electrodes and the extended-proximity capacitive sensing electrode, and wherein the ESD shunt includes a protrusion extending towards the extended-proximity capacitive sensing electrode.

19. The sensing device of claim 12 wherein the assembly comprises a display system or device.

20. An electronic system comprising:
a system housing;
a substrate, the substrate configured to be physically coupled with the system housing;
a plurality of capacitive sensing electrodes disposed on the substrate, the plurality of capacitive sensing electrodes configured to detect objects that are relatively near a surface;
an electrostatic discharge (ESD) shunt disposed on the substrate, the ESD shunt shaped to at least partially surround the plurality of capacitive sensing electrodes, the ESD shunt having an associated first resistance;
a first exposed location, the first exposed location corresponding to a vulnerability in the system housing such that the first exposed location is subject to electrostatic discharge, the first exposed location having an associated first discharge path to the ESD shunt;
an extended-proximity capacitive sensing electrode formed outside the at least partially surrounded plurality of capacitive sensing electrodes, the extended-proximity capacitive sensing electrode configured to provide a relatively long range electrode field to detect objects that are relatively far from the surface, the extended-proximity capacitive sensing electrode having an associated second discharge path from the first exposed location, wherein the first discharge path is longer than the second discharge path, and wherein the extended-proximity capacitive sensing electrode has an associated second resistance, the second resistance greater than the first resistance such that an electrostatic discharge at the first exposed location would be attracted to the ESD shunt via the first discharge path instead of the extended-proximity capacitive sensing electrode via the second discharge path; and
a processor physically coupled to the substrate, coupled to the plurality of capacitive sensing electrodes, and coupled to the extended-proximity capacitive sensing electrode, the processor configured to detect capacitances using the plurality of capacitive sensing electrodes and the extended-proximity capacitive sensing electrode.

\* \* \* \* \*